United States Patent [19]

Davis et al.

[11] Patent Number: 4,717,886
[45] Date of Patent: Jan. 5, 1988

[54] OPERATIONAL AMPLIFIER UTILIZING RESISTORS TRIMMED BY METAL MIGRATION

[75] Inventors: William F. Davis, Tempe; David M. Susak, Mesa; Robert L. Vyne, Tempe, all of Ariz.

[73] Assignee: Motorola, Inc., Schaumburg, Ill.

[21] Appl. No.: 880,537

[22] Filed: Jun. 30, 1986

[51] Int. Cl.$^4$ ............................................. H03F 3/45
[52] U.S. Cl. ..................................... 330/252; 330/257
[58] Field of Search ................... 330/9, 252, 257, 307; 338/20; 357/51

[56] References Cited

U.S. PATENT DOCUMENTS

| 4,446,613 | 5/1984 | Beinglass et al. | 357/51 X |
| 4,517,524 | 5/1985 | Davis | 330/257 |

*Primary Examiner*—Eugene R. LaRoche
*Assistant Examiner*—Steven J. Mottola
*Attorney, Agent, or Firm*—Vincent B. Ingrassia

[57] ABSTRACT

First and second resistors of a resistive network formed in a semiconductive substrate may be individually trimmed. The first and second resistive regions coupled at one end thereof have their other ends provided with metallic contacts. The resistive regions are disposed on the substrate such that current flowing from the first metallic contact to the second metallic contact through the first and second resistive regions causes the resistance of the first resistive region to be preferentially reduced. In contrast, current flowing from the second metallic contact to the first metallic contact through the first and second resistive regions causes the resistance of the second resistive region to be preferentially reduced. The resistive network is used in an operational amplifier circuit so as to permit the input offset voltage to be substantially reduced by selective trimming.

8 Claims, 6 Drawing Figures

OPERATIONAL AMPLIFIER UTILIZING RESISTORS TRIMMED BY METAL MIGRATION

BACKGROUND OF THE INVENTION

This invention relates generally to operational amplifier integrated circuits and, more particularly, to an operational amplifier which utilizes resistors which may be individually trimmed by metal migration after packaging.

It is now known that a diffused resistor on an integrated circuit die may be trimmed by metal migration. This is accomplished by pulsing the resistor with high amplitude, small duty cycle current pulses. The approach is especially useful in production and has definite advantages over laser trimming, link blowing, or zener zapping. First, the resistors can now be trimmed after the integrated circuit is packaged. Second, the resistors trimmed by metal migration (RTMM) occupy very little die area. Third, in some integrated circuits, 25% of the die area is required for trim and protection circuitry. Using RTMM resistors, a test computer performs a trim algorithm, not digital logic on the chip. Fourth, RTMM resistors exhibit increased accuracy and resolution. That is, they undergo resistance changes as small as 25 milli ohms/pulse on a 25 ohm resistor. Finally, no additional expensive equipment is required.

Assuming a silicon substrate and aluminum contacts, when small duty cycle current pulses are applied to the RTMM resistors, electron momentum exchange causes some movement of silicon and aluminum atoms in the direction of current flow, commonly referred to as electromigration. As the resistor temperature rises, however, the ability of aluminum to dissolve silicon increases. This phenomenon causes an aluminum filament to grow from the positive terminal, dissolving silicon as it grows, toward the negative terminal, against the flow of electrons. As the filament grows, the resistive value decreases.

In the past, the precision of operational amplifiers has been limited by input offset voltages, the major cause of which is induced stress after packaging. Past attempts to solve this problem are generally cost prohibitive.

SUMMARY OF THE INVENTION

It is an object of the present invention to provide an operational amplifier integrated circuit which may be trimmed with respect to input offset voltage ($V_{OS}$) after packaging through the use of RTMM resistors.

According to a broad aspect of the invention there is provided an improved operational amplifier integrated circuit formed in a semiconductor substrate of the type wherein a current source supplies current to first and second differentially coupled input transistors each having a base electrode coupled to first and second input terminals and each of the first and second input transistor coupled to a current mirror circuit, the improvement comprising a first RTMM resistor coupled between the current source and the first input transistor, a second RTMM resistor coupled between the current source and the second input transistor, first diode means coupled to the first input terminal and to the first input transistor for conducting current from the first input terminal, around the first input transistor and through the first and second RTMM resistor, and second diode means coupled to the second input terminal and to the second input transistor for conducting current from the second input terminal, around the second input transistor, and through the second and first RTMM resistors, the first and second resistors being directionally oriented on the substrate such that current flowing from the first input terminal toward the second input terminal will reduce the resistance of the first RTMM resistor, and current flowing from the second input terminal towards the first input terminal will reduce the resistance of the second RTMM resistor.

The above and other objects, features and advantages of the present invention will be more clearly understood from the following detailed description taken in conjunction with the accompanying drawings in which:

DESCRIPTION OF THE PREFERRED EMBODIMENT

Figure 1:
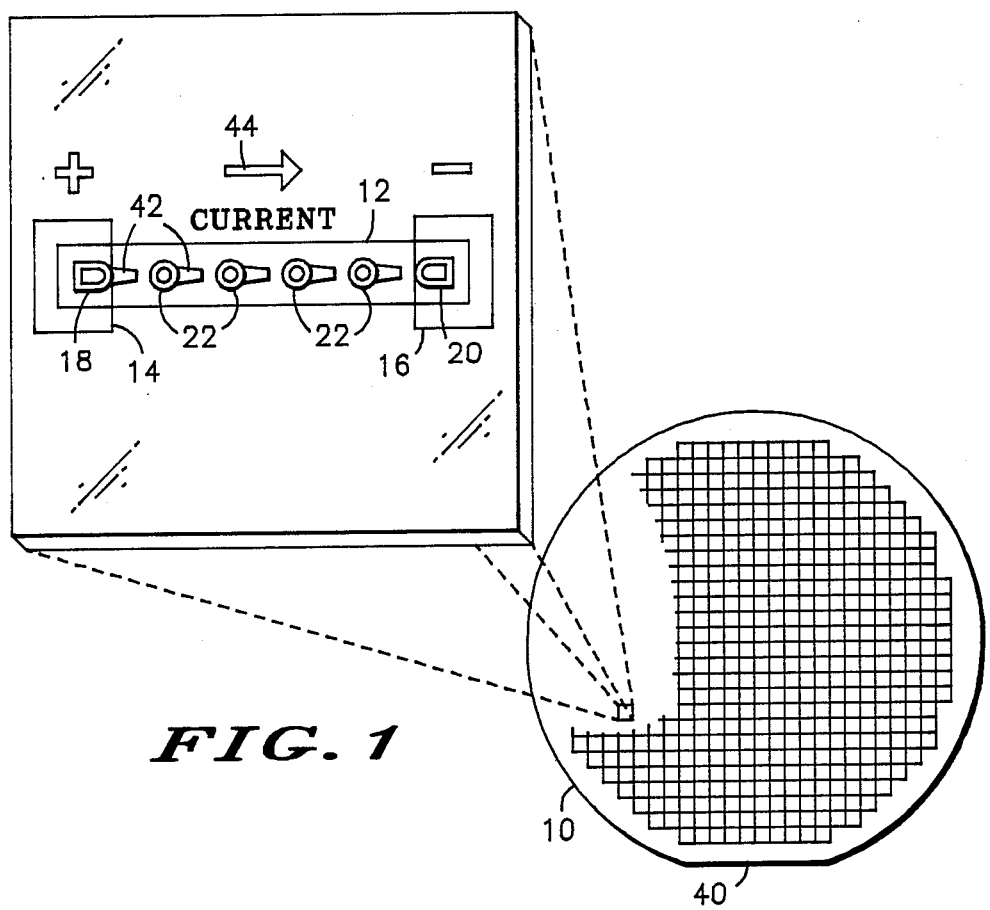
FIG. 1 is a top view of an RTMM resistor on a semiconductor wafer trimmed by passing current pulses therethrough in a proper direction.

FIG. 1 is a top exploded view of a {111} oriented silicon wafer 10 having a diffused resistor 12 thereon. Contact pads 14 and 16 are provided for contacting metallic (e.g. aluminum) contacts 18 and 20 respectively at opposite ends of the resistor. In addition, a plurality of intermediate metallic contacts 22 are provided.

Figure 2:
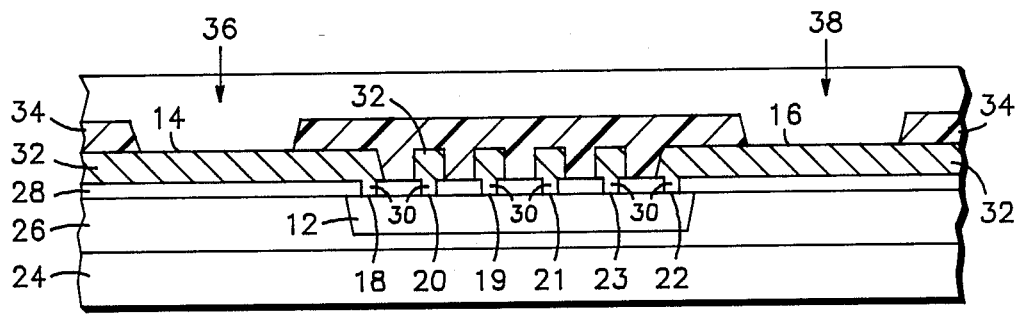
FIG. 2 illustrates in cross-section the RTMM resistor of FIG. 1.

FIG. 2 is a cross-sectional view illustrating the typical manner in which the resistor shown in FIG. 1 is constructed. A P-type silicon substrate 24 is covered by an N-type epitaxial layer 26. Resistive region 12 is formed by, for example, diffusing an N type dopant into epitaxial layer 26. An insulating layer 28, preferably nitride, is deposited over epitaxial layer 26 and openings 30 are etched therein. A metal layer 32 is then deposited over the insulating layer 28 and into openings 30 thus creating metal contacts 18, 20 and 22. A protective glass layer 34 is deposited over metal 32 and openings 36 and 38 formed therein so as to provide access to pads 14 and 16.

Figure 3:
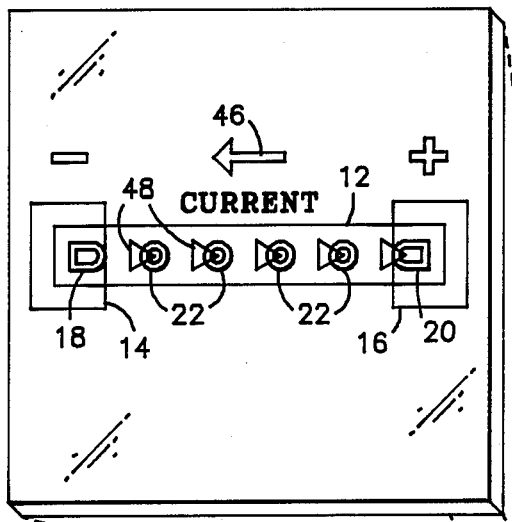
FIG. 3 is a top view of an RTMM resistor on a semiconductor wafer trimmed by passing current therethrough in an improper direction.
Figure 3:
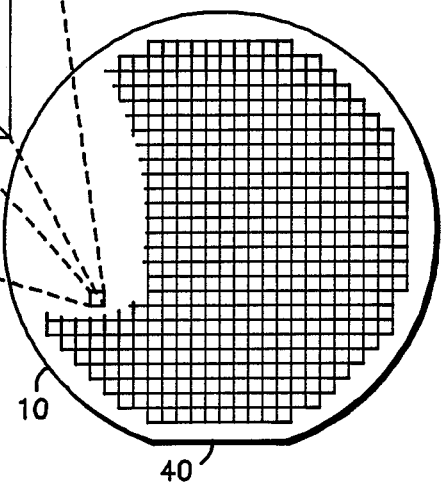

It was discovered that when using a {111} oriented silicon wafer 10 having a diffused resistor 12 running parallel to the [110] flat 40 (FIG. 1) that there was a difference in the shape of the aluminum flow into the silicon towards the negative terminal that was dependent upon the direction of electron flow in resistor 12 during trimming. That is, referring to wafer 10 in FIG. 1 having a flat 40 at the bottom (6 o'clock), if the electron flow is from right to left and conventional current is from left to right as indicated by arrow 44, a narrow filament of aluminum 42 is observed to grow from contacts 18 and 22 into the silicon to the right of that contact. If, however, electron flow during trim is from left to right and conventional current is from right to left as indicated by arrow 46 in FIG. 3, a comparatively wide area of aluminum 48 forms to the left of the aluminum contact.

This behavior is attributed to the directions of the {111} crystal planes in the silicon relative to the direction of the aluminum-silicon alloy filament growth. The {111} planes are the close-packed planes making it most difficult to dissolve silicon in direction normal to these planes. The dissolving of silicon takes place more readily in directions that are not normal to the {111} planes. Thus, it is much easier for the aluminum to dissolve silicon in any of the three directions corresponding to the intersection of the {111} planes than it does normal to the {111}planes. If a resistor to be trimmed is formed parallel to the wafer flat, a narrow filament of aluminum-silicon alloy grows to the right when the trimming high current electrons flow to the left (viewed with the wafer flat at 6 o'clock). The filament is fairly narrow since widening of the filament would require dissolution in a direction with a component normal to the (111) plane.

If, on the other hand, the trimming current were reversed so that electrons move from left to right in the above oriented resistor, a very wide filament of aluminum-silicon alloy would grow to the left of the contacts since it is easier to dissolve silicon from the crystal in directions parallel to the {111} planes than near normal to them.

Since there are three directions in the {111} oriented crystals in which etch pit facets intersect, there are three optimum directions in which resistors can be constructed. These are 120 degrees apart and are in the crystal directions [11$\bar{2}$], [1$\bar{2}$1] and [$\bar{2}$11]. A narrow filament of alloy would grow from an ohmic contact in a direction opposite to the electron flow if the electron flow were directed towards an apex of the etch pit. Similarly, a wide filament would grown from the ohmic contact opposite the direction of electron flow if the electron flow were directed towards an apex of the etch pit.

In the case of a {100} oriented silicon wafer, there are two directions in which the {111} planes intersect to form a four-sided pyramid shaped etch pit. Thus, there are two directions along which trimmable resistors can be constructed which would produce narrow filaments in the direction opposite to the electron flow. These are the [010] and the [001] directions and are located at angles 45 degrees and 135 degrees from the [011] oriented flat. A more detailed discussion of the crystallographic orientation of silicon wafers can be found in "OPTIMUM CRYSTALLOGRAPHIC ORIENTATION FOR SILICON DEVICE FABRICATION" by Duane O. Townley, Solid State Technology, January, 1973, pages 37-41.

As suggested above, the directions in which resistors can be directed and exhibit the desired natural filament growth are related to etch pit. That is, the etch pit in {111} silicon consists of three intersecting (111) planes forming a tetrahedron shaped pit. The intersections of the {111} planes point in three directions 120 degrees apart. It will be noted that an etch pit apex point containing an intersection of two (111) planes is directed parallel to the flat of the wafer and to the right. To the left of the etch pit there exists a (111) plane. Thus, it is easier for aluminum to dissolve silicon from the crystal into the alloy along the intersection of two (111) planes to the right than it would from the (111) plane to the left.

Figure 4:
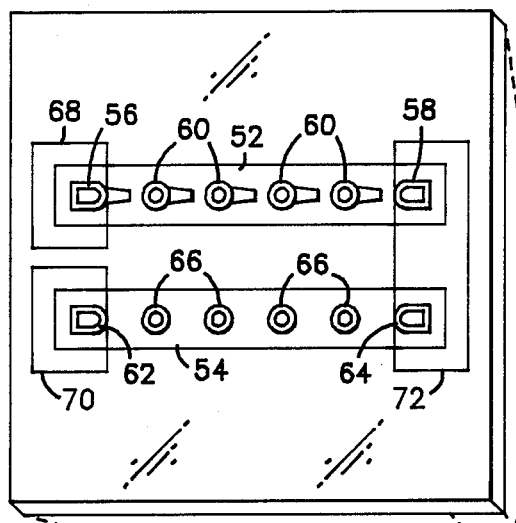
FIG. 4 is a top view of an RTMM resistor pair on a semiconductor wafer in accordance with the present invention.
Figure 4:
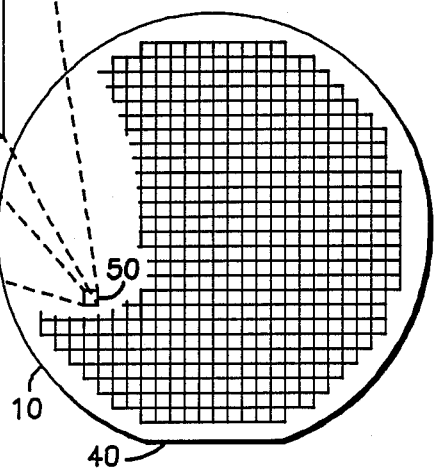

It is the directional trimming characteristic of RTMM resistors that gives rise to the present invention; i.e. the ability to individually trim first and second resistors utilizing only two trim pads. Referring to FIG. 4, a {111} silicon wafer 10 having flat 40 includes an individual die 50 having formed therein first and second resistor regions 52 and 54 of the type described hereinabove. Resistor 52 is provided with first and second metallic end contacts 56 and 58 and a plurality of intermediate metallic contacts 60. Resistor 54 is provided with first and second metallic end contacts 62 and 64 and a plurality of intermediate metallic contacts 66. Contact 56 is provided with contact pad 68, and contact 62 is provided with contact pad 70. A metal strip 72 couples metallic contacts 58 in resistor 52 and 64 in resistor 54 together. Based on the previous discussion, it should be apparent that both resistors 52 and 54 are oriented on die 50 in a preferred crystallographic direction. As stated previously, a narrow filament of aluminum-silicon alloy is expected to grow to the right when the trimming high current electrons flow to the left. Therefore, if it were desired to trim resistor 52, the low duty cycle high current pulses would be caused to flow from contact pad 68 to contact pad 70. In this manner, conventional current flows from left to right in resistor 52 causing it to be trimmed. However, in resistor 54, the current is flowing from right to left and therefore trimming does not occur. When it is desired to trim resistor 54, the conventional current pulses are caused to flow from contact pad 70 toward contact pad 68. Now, current is flowing in the proper preferred direction through resistor 54 causing resistor 54 to be trimmed while the value of resistor 52 remains substantially unchanged.

Thus, an approach has been described whereby the first and second resistors may be individually trimmed utilizing no more than two trimming pads. This can be accomplished after packaging.

Figure 5:
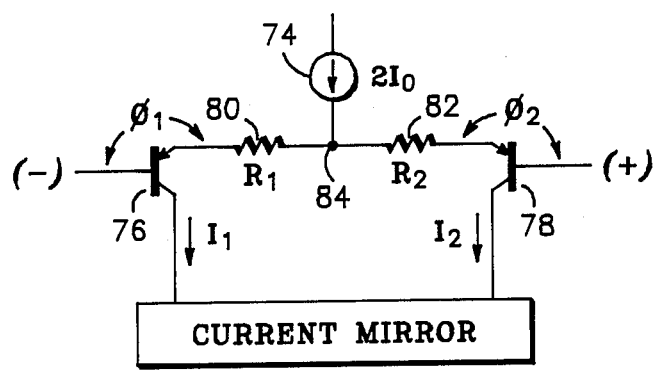
FIG. 5 is a schematic diagram illustrating how input offset voltage may be calculated.

FIG. 5 illustrates the input stage of an operational amplifier as comprising current source 74 which generates a current $2I_0$, first and second PNP input transistors 76 and 78 each having a base electrode coupled to a differential input signal, and emitter resistors 80 and 82 having resistances $R_1$ and $R_2$ respectively. As can be seen, resistor 80 is coupled between node 84 and the emitter of transistor 76, and resistor 82 is coupled between node 84 and the emitter of transistor 78. The collectors of transistors 76 and 78 conduct currents $I_1$ and $I_2$ and are coupled to a current mirror circuit 86 in the well known manner.

The input offset voltage Vos appearing across the base terminals of transistors 76 and 78 may be defined as $$V_{os} = \phi_1 + I_1R_1 - I_2R_2 - \phi_2$$
$$= \phi_1 - \phi_2 + I_1R_1 - I_2R_2$$

where $\phi_1$ and $\phi_2$ are the base emitter voltages of transistors 76 and 78 respectively. It should be apparent that should a positive offset voltage exist, it may be trimmed by increasing the value of $R_2$. Similarly, if a negative offset voltage should exist, it may be substantially eliminated by increasing $R_1$.

Figure 6:
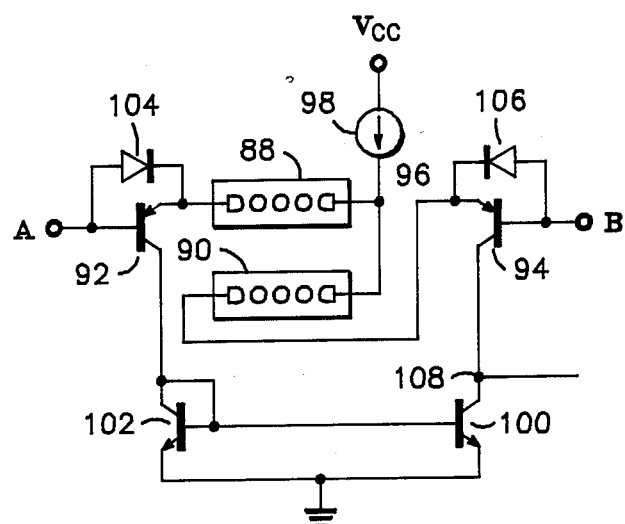
FIG. 6 is a schematic diagram of the inventive operational amplifier circuit.

FIG. 6 is a schematic diagram of the input stage of an operational amplifier including RTMM resistors 88 and 90. As can be seen, input PNP transistors 92 and 94 have their base terminals coupled to inputs A and B respectively. Resistor 88 is coupled between node 96 and the emitter of transistor 92, and resistor 90 is coupled between node 96 and the emitter of transistor 94. Current source 98 is coupled between node 96 and a source of supply voltage ($V_{CC}$). The collectors of transistors 92 and 94 are coupled to a current mirror circuit comprised of NPN transistor 100 and diode coupled NPN transistor 102. A first diode 104 has its anode coupled to input terminal A and its cathode coupled to the emitter of transistor 92. A second diode 106 has its anode coupled to input terminal B and its cathode coupled to the input of transistor 94.

Ignoring for the moment resistors 88 and 90 and diodes 104 and 106, the input stage operates in the well known manner. Should the voltage at terminal A exceed that at terminal B, the current flowing through transistor 92 will be lower than that flowing through transistor 94. Through the action of the current mirror circuit, transistor 100 will attempt to pull from node 108 a current substantially equal to that flowing in the collector of transistor 92. Since this is less than the current flowing into node 108, the voltage at node 108 will rise. Conversely, should the voltage at node A be less than that at node B, more current will flow in the collector of transistor 92 than flows in the collector of transistor 94. However, due to the current mirror action, transistor 100 will attempt to pull more current out of node 108 than is being supplied thereto and as a result, the voltage at node 108 will fall.

Should an offset voltage exist between input terminals A and B, it may be substantially eliminated by trimming either resistor 88 or 90 as described above. If it were desired to trim resistor 88, input terminal A may be pulsed positive while input terminal B is grounded. In this case, the current pulse will flow from input terminal A through diode 104, resistor 88, resistor 90, and transistor 94 to input terminal B. However, for reasons described above, only resistor 88 will be trimmed (i.e. its resistance reduced). If, in contrast, it were desired to reduce the resistance of resistor 90, input terminal B would be pulsed positive while input terminal A would be grounded. In this case, the current pulse flows through diode 106, resistor 90, resistor 88, and transistor 92 to input terminal A. In this manner, the resistance of resistor 90 will be reduced while that of resistor 88 will remain substantially the same.

Thus, there has been described a circuit wherein input offset voltages may be substantially eliminated through the use of RTMM resistors utilizing only the already available input terminals A and B.

The above description is given by way of example only. Changes in form and details may be made by one skilled in the art without departing from the scope of the invention as defined by the appended claims.

We claim:

1. An improved operational amplifier integrated circuit formed in a semiconductor substrate of the type wherein a current source supplies current to first and second differentially coupled input transistors each having a base electrode coupled to first and second input terminals and each of said first and second input transistor coupled to a current mirror circuit, the improvement comprising:
   a first RTMM resistor coupled between said current source and said first input transistor;
   a second RTMM resistor coupled between said current source and said second input transistor;
   first diode means coupled to said first input terminal and to said first input transistor for conducting current from said first input terminal, around said first input transistor and through said first and second RTMM resistor; and
   second diode means coupled to said second input terminal and to said second input transistor for conducting current from said second input terminal, around said second input transistor, and through said second and first RTMM resistors;
   said first and second resistors being directionally oriented on said substrate such that conventional current flowing from said first input terminal toward said second input terminal will reduce the resistance of said first RTMM resistor, and current flowing from said second input terminal towards said first input terminal will reduce the resistance of said second RTMM resistor.

2. An operational amplifier according to claim 1 wherein said first and second input transistors each have emitter and collector terminals, said first diode means having an anode coupled to the base of said first transistor and a cathode coupled to the emitter of said transistor and wherein said second diode means has an anode coupled to the base of said second input transistor and a cathode coupled to the emitter of said second input transistor, the collectors of said first and second input transistors being coupled to said current mirror circuit.

3. An operational amplifier according to claim 2 wherein said first and second differentially coupled input transistors are PNP transistors.

4. An operational amplifier according to claim 1 wherein said first and second RTMM resistors are directionally oriented on said substrate such that current flowing between said first and second input terminals flows in first and second different directions in said first and second resistors respectively.

5. An operational amplifier integrated circuit formed in a semiconductor substrate, comprising:
   first and second differentially coupled PNP input transistors each having base, emitter and collector terminals, the base of said first and second transistors being coupled to first and second input terminals respectively;
   current mirror means coupled to the collectors of said first and second input transistors;
   first diode means having an anode coupled to said first input terminal and a cathode coupled to the emitter of said first input transistor;
   second diode means having an anode coupled to said second input terminal and a cathode coupled to the emitter of said second transistor;
   a power supply node;
   a first RTMM resistor having a first end coupled to said power supply node and a second end coupled to the emitter of said first input transistor and to the cathode of said first diode means; and
   a second RTMM resistor having a first end coupled to said power supply node and a second end coupled to the emitter of said second input transistor and to the cathode of said second diode means, said first and second RTMM resistors being directionally oriented on said substrate such that conventional current flowing from said first input terminal toward said second input terminal through said first diode means and said first and second RTMM resistors will decrease the resistance of said first RTMM resistor, and current flowing from said second input terminal through said second diode means and said first and second RTMM resistors will decrease the resistance of said second RTMM resistor.

6. An operational amplifier according to claim 5 wherein each of said first and second RTMM resistors comprises:

a resistive region in said substrate having first and second ends; and first and second metallic contacts for contacting the first and second ends of each of said first and second resistive regions.

7. An operational amplifier according to claim 6 wherein said substrate is silicon and said first and second metallic contacts of said first and second RTMM resistors are aluminum.

8. An operational amplifier according to claim 7 wherein said substrate is a {111} crystalline substrate and said first and second resistors are disposed in a direction selected from the group consisting of $[11\bar{2}]$, $[1\bar{2}1]$, and $[\bar{2}11]$.

* * * * *